(12) United States Patent
    Athreya et al.

(10) Patent No.: US 11,769,557 B2
(45) Date of Patent: Sep. 26, 2023

(54) TECHNIQUES FOR PREVENTING READ DISTURB IN NAND MEMORY

(71) Applicant: Intel Corporation, Santa Clara, CA (US)

(72) Inventors: Arun Sitaram Athreya, Folsom, CA (US); Shankar Natarajan, Folsom, CA (US); Sriram Natarajan, Folsom, CA (US); Yihua Zhang, Cupertino, CA (US); Suresh Nagarajan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 16/715,791

(22) Filed: Dec. 16, 2019

(65) Prior Publication Data
    US 2020/0118636 A1    Apr. 16, 2020

(51) Int. Cl.
    *G11C 16/04*    (2006.01)
    *G11C 16/34*    (2006.01)
    *G06F 3/06*     (2006.01)
    *G11C 16/26*    (2006.01)
    *G11C 11/56*    (2006.01)
    *G11C 16/08*    (2006.01)

(52) U.S. Cl.
    CPC ........ *G11C 16/3427* (2013.01); *G06F 3/0604* (2013.01); *G06F 3/0659* (2013.01); *G06F 3/0688* (2013.01); *G11C 11/5642* (2013.01); *G11C 11/5671* (2013.01); *G11C 16/0483* (2013.01); *G11C 16/08* (2013.01); *G11C 16/26* (2013.01)

(58) Field of Classification Search
    CPC ............ G11C 16/3427; G11C 11/5642; G11C 11/5671; G11C 16/0483; G11C 16/08; G11C 16/26
    See application file for complete search history.

(56) References Cited

U.S. PATENT DOCUMENTS 11,443,798 B1 * 9/2022 Smith .................... G11C 5/145
2021/0064257 A1 * 3/2021 Cariello ............... G06F 3/0617

* cited by examiner

*Primary Examiner* — Pho M Luu
(74) *Attorney, Agent, or Firm* — Compass IP Law PC

(57) ABSTRACT

Techniques for preventing read disturb in NAND memory devices are described. In one example, reads are tracked for sub-groups. When the number of reads to a sub-group meets a threshold, the data at the wordline on which the threshold was met is moved along with the data at neighboring wordlines to an SLC block without moving the entire block. The performance impact and write amplification impact of read disturb mitigation can be significantly reduced while maintaining some data continuity.

18 Claims, 8 Drawing Sheets

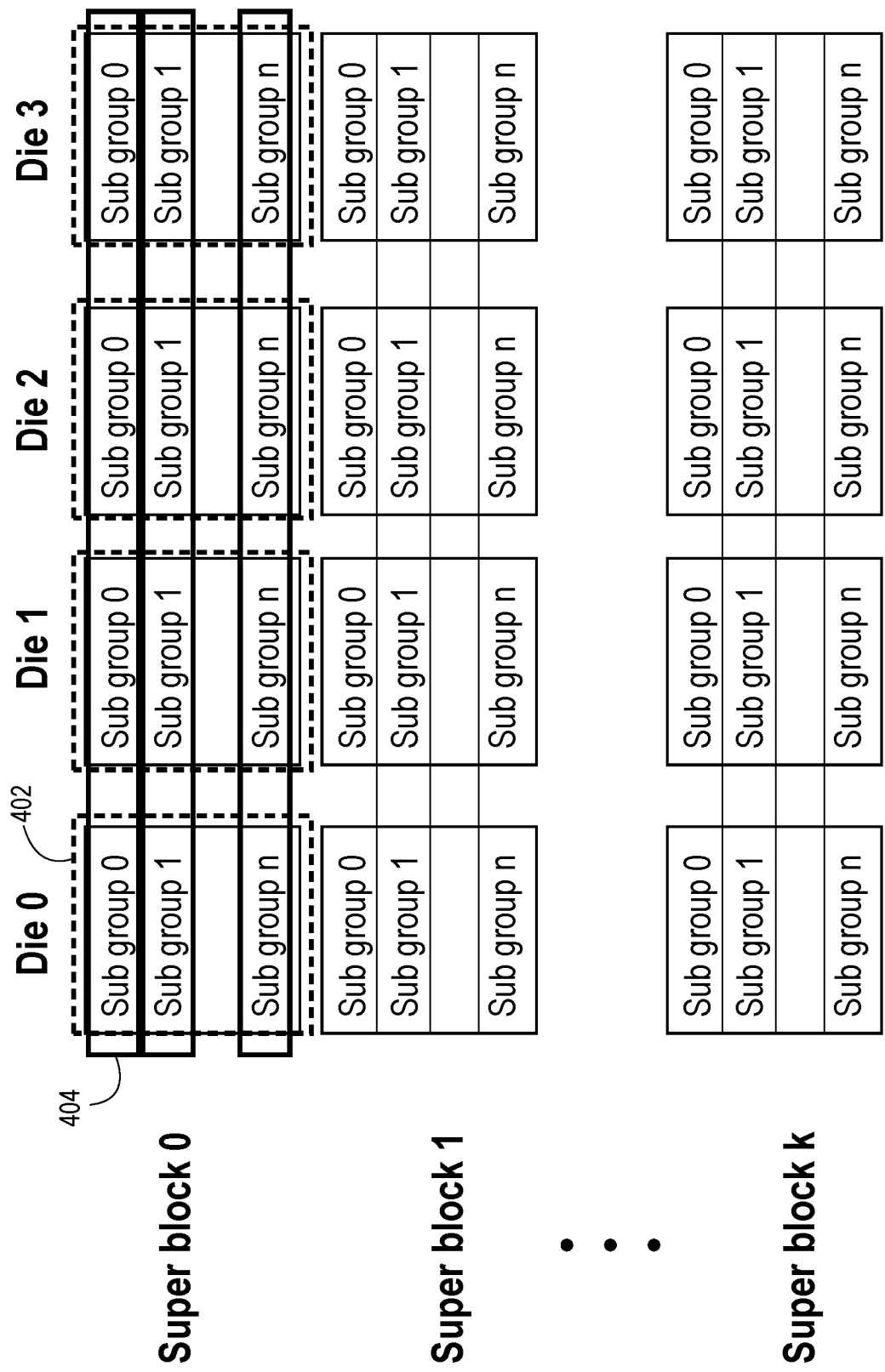

US 11,769,557 B2

TECHNIQUES FOR PREVENTING READ DISTURB IN NAND MEMORY

FIELD

The descriptions are generally related to non-volatile storage media such as NAND flash memory and techniques for minimizing read disturb.

BACKGROUND

Flash storage, such as NAND flash memory, is a non-volatile storage medium. Nonvolatile storage refers to storage having a state that is determinate even if power is interrupted to the device. Three dimensional (3D) NAND flash memory refers to NAND flash memory in which a NAND string may be built vertically so that field effect transistors (FETs) of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. In addition to the high bit density, other metrics, such as low error rate, are also desirable in storage technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIG. 4 is a block diagram illustrating an example of read counters for a NAND device.

Descriptions of certain details and implementations follow, including a description of the figures, which may depict some or all of the embodiments described below, as well as discussing other potential embodiments or implementations of the inventive concepts presented herein.

DETAILED DESCRIPTION

Described herein are techniques for efficiently handling read disturb in non-volatile memory, such as three dimensional (3D) NAND memory.

Memory accesses in current NAND memory technology can result in a variety of errors, such as program disturb or read disturb errors. Read disturb refers to the unintentional programming of one or more bits during a read operation. Certain access patterns can increase the likelihood of read disturb errors. For example, repeated reads to a single page can result in a hot-electron type read disturb error, which can cause an ECC uncorrectable event. Hot electron read disturb refers to unexpected change of data values in a part of a wordline or block of memory that is not the target of a read command but is charged to service the read request.

Some existing solutions to mitigate read disturb involve monitoring the number of reads to a QLC block and moving the entire block of data to another QLC block before the read threshold is reached. Moving the entire block of data from one QLC block to another QLC block results in significant performance penalties and carries the risk of data corruption.

In contrast to existing techniques, moving only the hot wordline and neighboring wordlines of a QLC block to an SLC block can prevent read disturb without significant performance penalties. Furthermore, moving only the affected wordlines instead of an entire QLC block (or superblock) reduces the number of writes, and thus reduces the write amplification impact. Additionally, by moving three consecutive wordlines, a portion of the data is still sequential, which can enable delivering consistent quality of service with respect to performance.

Figure 1:
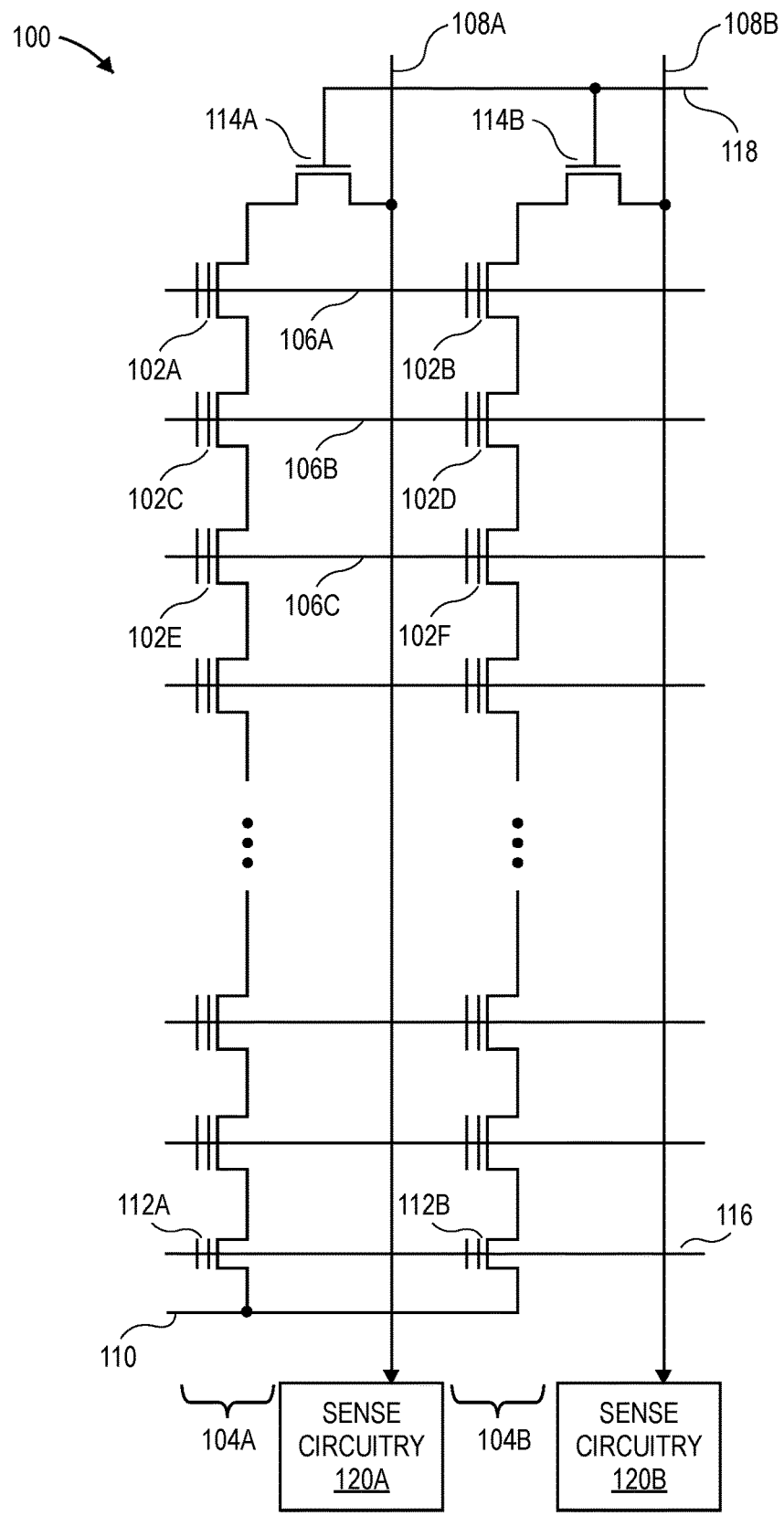
FIG. 1 depicts an example portion of a NAND flash memory array in which read disturb prevention techniques can be implemented.

FIG. 1 depicts an example portion of a NAND flash memory array (or NAND storage array) 100 for which read disturb prevention techniques can be implemented. The NAND array 100 includes multiple non-volatile memory cells 102A-102F (abbreviated as 102) arranged in columns, such as series strings 104A and 104B (abbreviated as 104). In one example, the memory cell 102 includes a transistor with a replacement gate. A cell with a replacement gate typically has a low resistance gate (e.g., a tungsten gate) and a charge trap layer between the gate and the channel where charge is trapped or stored to represent one or more bit values. In another example, a memory cell 102 can include a transistor with a floating gate (e.g., a high resistance poly gate) that stores charge indicative of one or more bit values. Other architectures are also possible. In the series strings 104, drain regions of cells 102 are (with the exception of the top cell) coupled to a source region of another cell 102.

The array 100 also includes wordlines 106A-106C. The wordlines 106A-106C can span across multiple series strings 104 (e.g., a wordline may be coupled to one memory cell of each series string 104) and are connected to the control gates of each memory cell 102 of a row of the array 100 and used to bias the control gates of the NAND memory cells 102 in the row. The bitlines 108A and 108B (abbreviated as 108) are each coupled to a series string 104 by a select gate drain (SGD) 114 and sensing circuitry 120A and 120B that detects the state of each cell by sensing voltage or current on a particular bitline 108.

Multiple series strings 104 of the memory cells are coupled to a source line 110 by a select gate source (SGS) 112A and 112B (abbreviated as 112) and to an individual bitline 108 by a select gate drain 114A and 114B (abbreviated as 114). The SGSs 112 are controlled by a source select gate control line 116 and the SGDs 114 are controlled by a drain select gate control line 118. Thus, an SGD signal line selectively couples a string to a bitline (BL). An SGS signal line selectively couples a string to a source line (SL). The SGS can be segmented into multiple segmented SGSs (SSGS) to effectively operate as separate SGS signal lines to control the operation of separate groups of storage cell stacks. A group of memory cells controlled by an SSGS can be referred to as an SSGS group, sub-block, or sub-group. Similarly, the SGD can be segmented to provide separate control for the different sub-blocks, with one SGD segment per sub-block.

Figure 2:
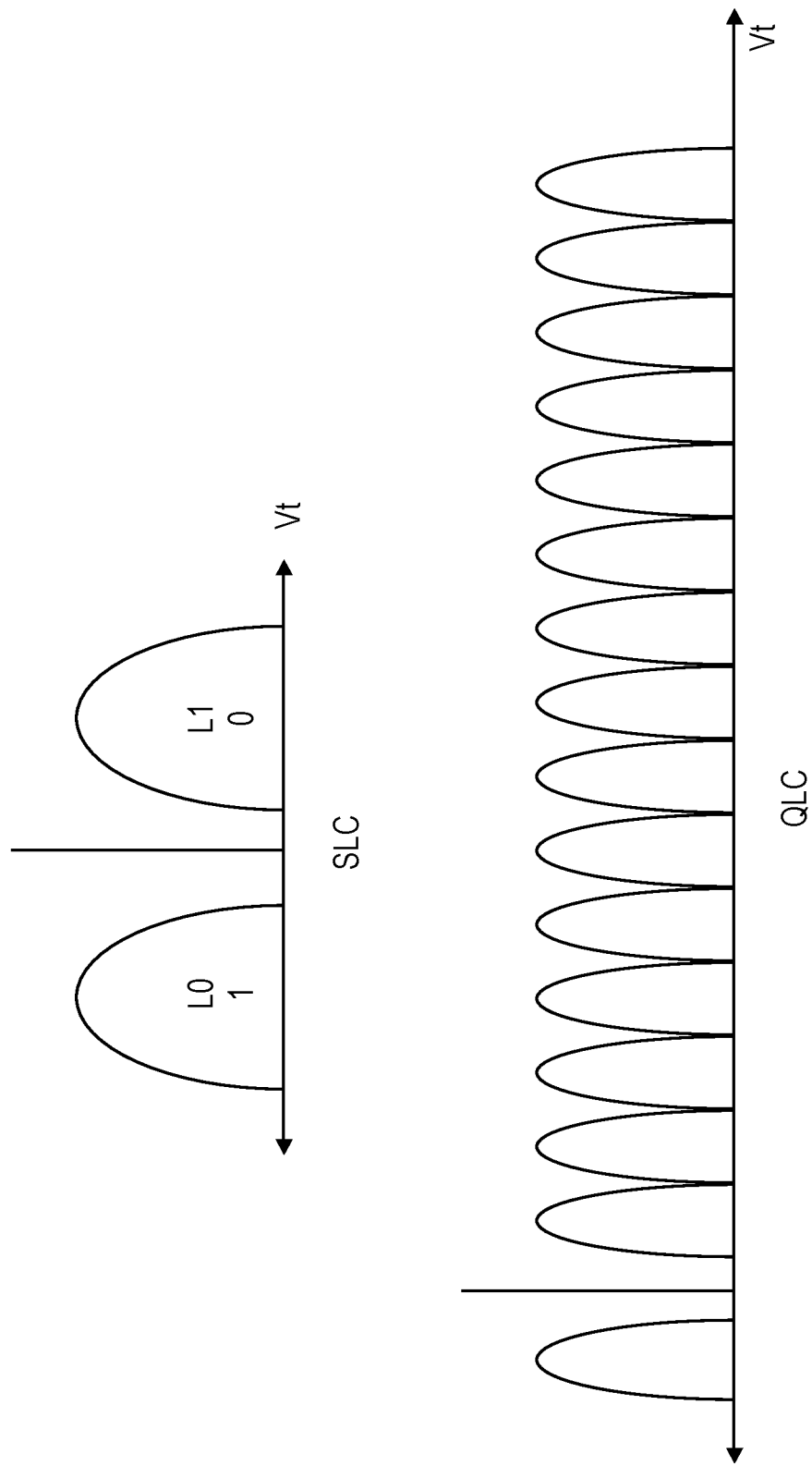
FIG. 2 illustrates an example of threshold voltage distributions for an SLC cell and a QLC cell.

Each memory cell 102 can be programmed according to one or more encoding schemes such as SLC (single level cell), MLC (multi-level cell), TLC (triple level cell), QLC (quad level cell), or other encoding scheme. In a SLC NAND flash memory, each memory cell has two voltage levels corresponding to two states (0, 1) to represent one bit. In a MLC, TLC and QLC NAND flash memory, each memory cell stores two or more bits. Each cell in a MLC NAND Flash memory uses four voltage levels corresponding to four states (00, 01, 10, 11) to represent 2 bits of binary data. Each cell in a TLC NAND Flash memory uses eight voltage levels corresponding to eight states (000 to 111) to represent 3 bits of binary data. Each cell in a QLC NAND Flash memory uses sixteen voltage levels corresponding to sixteen states (0000 to 1111) to represent 4 bits of binary data. In one example, each cell's threshold voltage (Vt) is indicative of the data that is stored in the cell. For example, FIG. 2 illustrates an example of threshold voltage distributions for an SLC cell and a QLC cell.

Figure 3A:
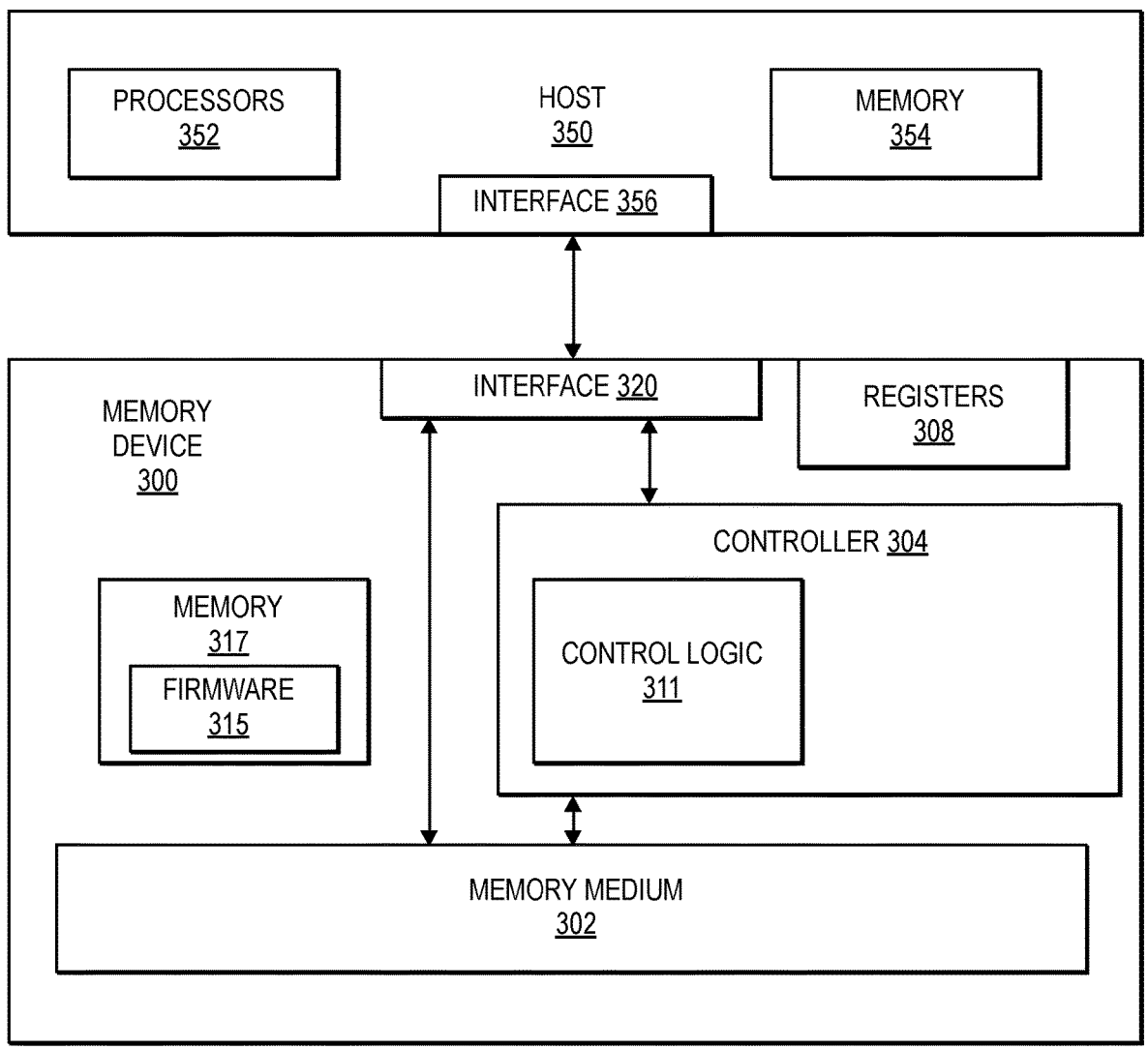
FIG. 3A depicts an example system.

FIG. 3A depicts an example system. The system includes a host 350 and a non-volatile storage or memory device 300. The host 350 and memory device 300 can be an example of a system that exists within the confines of a computer's package (e.g., within a laptop/notebook, server, or other computer). In other examples, the memory device 300 may also be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 350 includes one or more processors 352, memory 354, and other components that are omitted from the drawing for clarity.

The memory device includes a memory medium 302 for storing data. Memory medium 302 can be a memory or storage medium that can store one or more bits in memory cells. In one example, the memory medium 302 includes a storage array that includes strings of memory cells such as the NAND string illustrated in FIG. 1. The memory medium 302 can include non-volatile and/or volatile types of memory. In one example, the memory medium 302 includes one or more non-volatile memory die, each divided into multiple planes or groups. In some examples, the memory medium 302 can include block addressable memory devices, such as NAND technologies. In one example, the memory medium 302 includes a NAND flash memory array such as in FIG. 1. The memory medium 302 can also include non-volatile types of memory, such as crosspoint memory (e.g., three-dimensional (3D) crosspoint), or other byte addressable non-volatile memory. Other technologies, such as some NOR flash memory, may be byte addressable for reads and/or writes, and block addressable for erases. The memory medium 302 can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 302 can include a single-level cell (SLC) NAND cells, multi-level cell (MLC) NAND cells, triple-level cell (TLC) NAND cells, quad-level cell (QLC) cells, dynamic NANDS cells that can be used as more than one type of NAND (e.g., either SLC or QLC depending on the mode), or other NAND cells.

According to some examples, volatile types of memory included in the memory medium 302 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

The memory device 300 can communicate with a host system 350 using respective interfaces 320 and 356. In one example, the interface 356 is a part of a peripheral control hub (PCH). In the illustrated example, the controller 304 is coupled with a computing platform such as host 350 using the interface 320. In one example, the controller 304 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 304 can communicate with elements of the computing platform to read data from memory medium 302 or write data to memory medium 302. Although in this disclosure, the term "host" is referring to a system with a processor (or other device sending requests to access data stored in a non-volatile memory) and an interface for communicating with the NAND (e.g., the host 350), some implementations may refer to the controller 304 as a "host" relative to the non-volatile memory medium 302.

The controller 304 can be configured to receive requests from the host 350 and generate and perform commands concerning the use of memory medium 302 (e.g., to read data, write, or erase data). The controller 304 and/or firmware 315 can implement various write algorithms such as a "write through SLC buffer" or "write around SLC buffer." Both the write through and write around approaches involve writing host data to a frontend SLC buffer. The SLC buffer can include a dedicated SLC region, a dynamic region used in an SLC mode, or both. The "write through SLC buffer" approach includes writing all host data through an SLC buffer. Once the SLC buffer is full, space is made available in the SLC buffer by moving data to one or more QLC blocks. New host data can then be written to SLC buffer. The "write around SLC buffer" approach involves writing to SLC buffer as long as space is available. Once SLC buffer is full, host data is written directly to a QLC block. A write around approach typically requires super capacitors on the board to protect previously programmed data in the event of sudden power loss. In contrast, capacitors to protect against power loss are typically not required for the "Write through SLC buffer" approach. The techniques described herein apply to both write through SLC and write around SLC approaches.

The controller can be implemented with hardware (e.g., logic circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.). The memory device typically also includes memory 317 coupled to the logic circuitry 311 which can be used to cache data from the non-volatile media and store firmware 315 executed by the controller 304. The term "control logic" can be used to refer to both logic circuitry, firmware, software, or a combination. For example, control logic can refer to the control logic 311, firmware 315, or both.

The controller 304 is coupled with the memory medium 302 to control or command the memory to cause operations to occur. Communication between the memory medium 302 and the controller 304 may include the writing to and/or reading from specific registers (e.g., registers 308). Such registers may reside in the controller 304, in the memory medium 302, or external to the controller 304 and the memory medium 302. Registers or memory within the memory medium 302 may be reachable by the controller 304 by, e.g., an internal interface of the memory device 300 that exists between the controller 304 and memory medium 302 (e.g., an Open NAND Flash Interface (ONFI) interface, a proprietary interface, or other interface) to communicatively couple the controller 304 and memory medium 302. Input/output (I/O) pins and signal lines communicatively couple the controller 304 with the memory medium 302 to enable the transmission of read and write data between the controller 304 and the memory medium 302.

The controller 304 can be coupled to word lines of memory medium 302 to select one of the word lines, apply read voltages, apply program voltages combined with bit line potential levels, apply verify voltages, or apply erase voltages. The controller 304 can be coupled to bit lines of memory medium 302 to read data stored in the memory cells, determine a state of the memory cells during a program operation, and control potential levels of the bit lines to promote or inhibit programming and erasing.

Figure 3B:
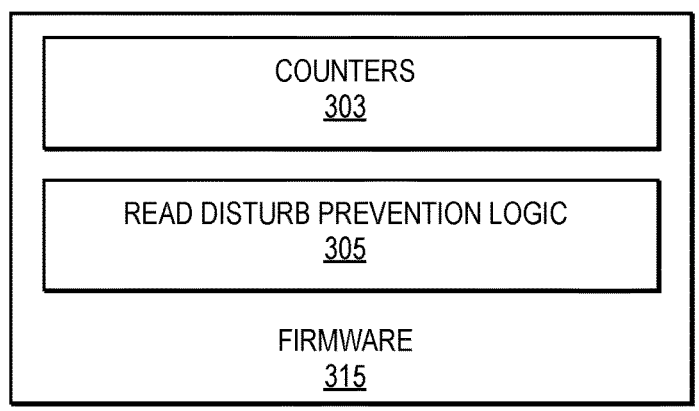
FIG. 3B is a block diagram of an example of firmware for handling read disturb.

As mentioned above, firmware 315 stored on the memory device can be executed (e.g., by the controller 304) to perform certain functions and control certain aspects of the memory device 300. In one example, the firmware 315 includes logic to handle read disturb prevention. FIG. 3B is a block diagram of an example of firmware 315 for handling read disturb. In the example in FIG. 3B, the firmware includes counters 303 to enable tracking read accesses to groups or sub-groups of memory cells and logic 305 to handle movement of data based on the counters 303 to prevent such read disturb errors.

As mentioned above, repeated single page reads beyond a threshold can create a hot-electron ECC uncorrectable event in NAND devices (e.g., both 2D and 3D NAND technology).

Conventionally, firmware would track read accesses at a block level and trigger a data move as a result of a read disturb (or preferably prior to the occurrence of a read disturb). Using conventional techniques, when a data move is triggered as a result of a read disturb, an entire block is moved to a new destination block. With QLC blocks getting bigger, the time to program is slower. Therefore, moving an entire block can cause a significant impact to the host performance.

For example, consider an example in which on triggering the read disturb threshold for a QLC block, the entire QLC block of data is moved as a blocking call or blocking operation to a new destination QLC block. By moving the entire block as a blocking call, any further host commands will not be serviced until the move is complete. As a result, the address table (e.g., logical to physical (L2P)) page table is updated after the data move is complete to ensure any further host reads are performed from the new destination block. Although this technique ensures the user data is intact, it can result in a timeout due to starving the host as a result of the blocking call for the data move from one QLC block to another QLC block. Furthermore, such a technique has a high write amplification (WA) impact because the whole QLC block of data is moved even though some pages may not be affected.

In another example, on triggering the read disturb threshold, the data move is distributed such that the host is not starved. Distributing the data move ensures that the performance is stable and uniform during the data move. However, the updates to the address table may not be performed until the destination QLC block is completely programmed (e.g., in the case of client SSDS that do not have PLI caps (power loss imminent capacitors)). Because the address table is not updated until the block is closed, the host reads continue to be serviced from the original victim block for which the read threshold was reached. Thus, victim pages can have a high amount of read stress leading to violation of NAND requirements and potential user data loss. This technique also results in a high write amplification impact because the whole block of data is moved even though some pages may not be affected.

In contrast, the performance and write amplification impacts of mitigating read disturbs can be avoided by moving only the data at affected wordline and neighboring wordlines to a fast media block, such as an SLC block. For example, upon reaching the read disturb threshold on QLC blocks, firmware moves data stored at WLn (the wordline on which that page is being hammered), WLn−1, and WLn+1 to an SLC block. In one example, the address table (e.g., logical to physical table) is updated post data move and subsequent reads on the same LBAs (logical block addresses) will be serviced from the new location on the NAND. In one example, firmware performs the move of the data at the three wordlines as a blocking operation so any host commands will not be serviced until the data move has completed. However, because the move is to SLC block, the data move completes relatively quickly, and the blocking call does not result in significant performance impacts or result in a host timeout.

In one example, to move only the affected and neighboring wordlines to prevent read disturb, the firmware tracks the number of reads received for sub-groups of memory cells. For example, FIG. 4 is a block diagram illustrating how a NAND device and counters can be logically organized into blocks and sub-groups. Thus, FIG. 4 illustrates one example of the granularity at which read accesses can be tracked. The example in FIG. 4 includes four dies: die 0, die 1, die 2, and die 3. Each die includes k+1 blocks. A NAND memory block is typically the smallest erasable entity in a NAND flash die. A superblock is typically defined as the same block address across multiple dies (e.g., a same wordline address across multiple NAND dies). Each block includes n+1 sub-groups, where each sub-group includes one or more pages. In one example, the sub-group includes 3 SLC pages, 9 TLC pages, or 12 QLC pages. Thus, each block can include a large number of pages, depending on the design and implementation. The firmware can also keep track of and update counters for read accesses for different granularities of pages. The example illustrated in FIG. 4 shows counters at a block-level for each die (boxes 402) and at a sub-group level across all dies (boxes 404). The die block-level counters record reads on any page in a block. The SSGS (sub-level) read counters record reads on a smaller page range. In one example, the die block-level read counters are meant to track distributed reads within a same block whereas the SSGS read counters are meant to track hammer read stress or single page read stress. Other granularities of counters may be used to track read accesses. In one example, the read access count for each sub-group for each die can be separately tracked (rather than a counter at the sub-group level that spans all dies).

As mentioned above, conventional techniques involved moving entire blocks to prevent read disturb. Thus, read accesses were tracked at a block level and data was moved off the entire block once a threshold was reached. In contrast to the conventional technique, tracking accesses at the sub-group level can enable the transfer of only the affected wordlines and reduce data transfers. In one example, the counters are implemented in firmware (e.g., a table, array, linked list, or other data structure).

Figure 5:
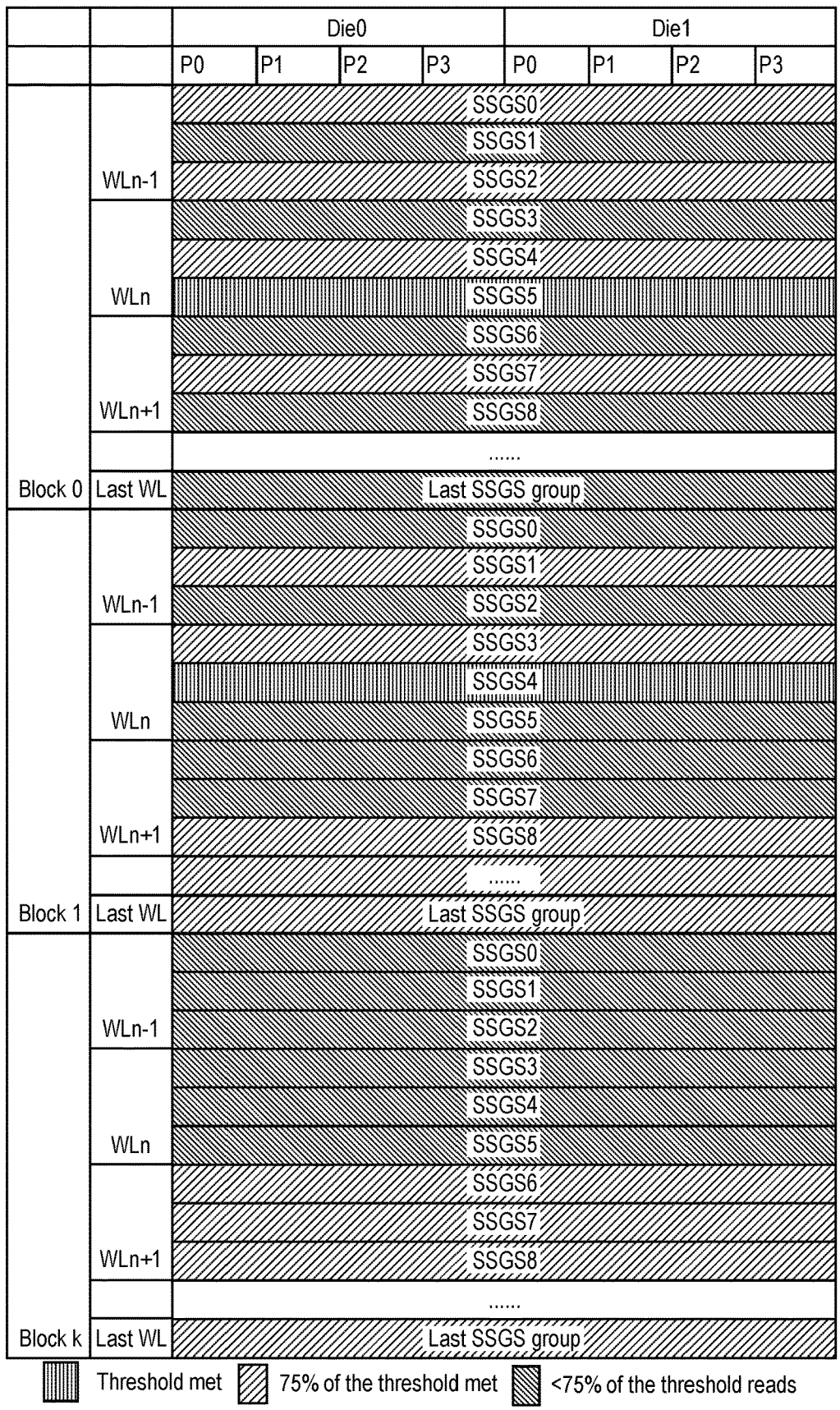
FIG. 5 illustrates an example representation of counters in the form of a heat table.

FIG. 5 illustrates an example representation of counters in the form of a "heat table." A heat table is a data structure to track which sub-groups are "hot," meaning, which sub-groups have received a number of read accesses that meets or is approaching a threshold. In the example illustrated in FIG. 5, "WLn" of Blocks 0 and 2 represent hot wordlines because at least one sub-group from that wordline has met the read threshold. None of the wordlines in Block k have met the threshold. "WLn−1" refers to the wordline immediately preceding WLn and "WLn+1" refers to the WL immediately following WLn. A heat table may track whether sub-groups have met the threshold or not (e.g., the threshold is either met or not met) or may track degrees of "hotness." For example, the example in FIG. 5 tracks varying levels of hotness. Specifically, the heat table in FIG. 5 shows that some sub-groups are approaching the threshold (e.g., at 75% of the threshold), and other sub-groups are well below the threshold (e.g., at less than 75% of the threshold). Tracking varying levels of access can enable different policies for different levels. However, a heat table or other data structure can track whether the threshold has been met as a binary toggle (e.g., either 'logic 1' indicating the threshold has been met or 'logic 0' indicating the threshold has not been met, or vice versa). By tracking the number of read accesses to sub-groups, data can be moved from the hot wordlines prior to read disturb-related data corruption.

The heat table in FIG. 5 shows a counter for each SSGS (segmented SGS) or sub-group, similar to the counters 404 of FIG. 4. Each SSGS spans across multiple dies. The example in FIG. 5 shows two dies (die 0 and die 1), however, the techniques described herein apply to one die or more than two dies. Each die includes four planes (P0, P1, P2, and P3) and k+1 blocks (blocks 0, 1, and k are shown). Each block includes multiple sub-groups, each sub-group including multiple pages. Each wordline includes three sub-groups, however, other examples may include fewer or more than three sub-groups. The groupings shown in FIG. 5 are non-limiting examples; the techniques described herein apply to a variety of groupings and logical segmentation of memory.

Firmware maintains a count or counter of read accesses for each sub-group (e.g., SSGS). When the memory device receives a read request to a particular sub-group, firmware updates (e.g., increments) the counter for that sub-group. Firmware then determines whether the count for the sub-group reached (or exceeded) the threshold. In addition to a counter, in one example, one or more bits are included in the data structure to track whether a sub-group or wordline has met the read threshold. In one example in which degrees of hotness are tracked, multiple bits can be included for each sub-group or each wordline, or both, to indicate the level of hotness. When one or more of the sub-groups in a wordline have reached the threshold, a data move is triggered to move the data from the hot wordline on the QLC block to an SLC block.

Although the read counter threshold for neighboring wordlines may not have been reached, the neighboring wordlines may experience the maximum gate stress (potentially even more gate stress than the hot wordline) and therefore may be more vulnerable to read disturb than the target WLn. Therefore, the data at wordlines before and after the hot wordline is also moved to the SLC block. For example, if WLn has met the read threshold, as is shown for Block 0 in FIG. 5, WLn−1 and WLn+1 are also moved from the QLC block to the SLC block. Although the examples herein generally refer to moving two neighboring wordlines, in one example, more than two neighboring wordlines but less than the entire block are moved (e.g., wordlines WLn−2, WLn−1, WLn+1, WLn+2, etc. can be moved in addition to the hot wordline). Thus, unlike in conventional techniques, a smaller amount of data is transferred to prevent read disturb errors. Furthermore, because a smaller amount of data is transferred, the data can be moved to an SLC block. Moving the data to an SLC block is much faster and less error-prone than moving the data to another QLC block. Therefore, the data move completes quickly and prevents significant performance hits resulting from the read disturb prevention.

Figure 6:
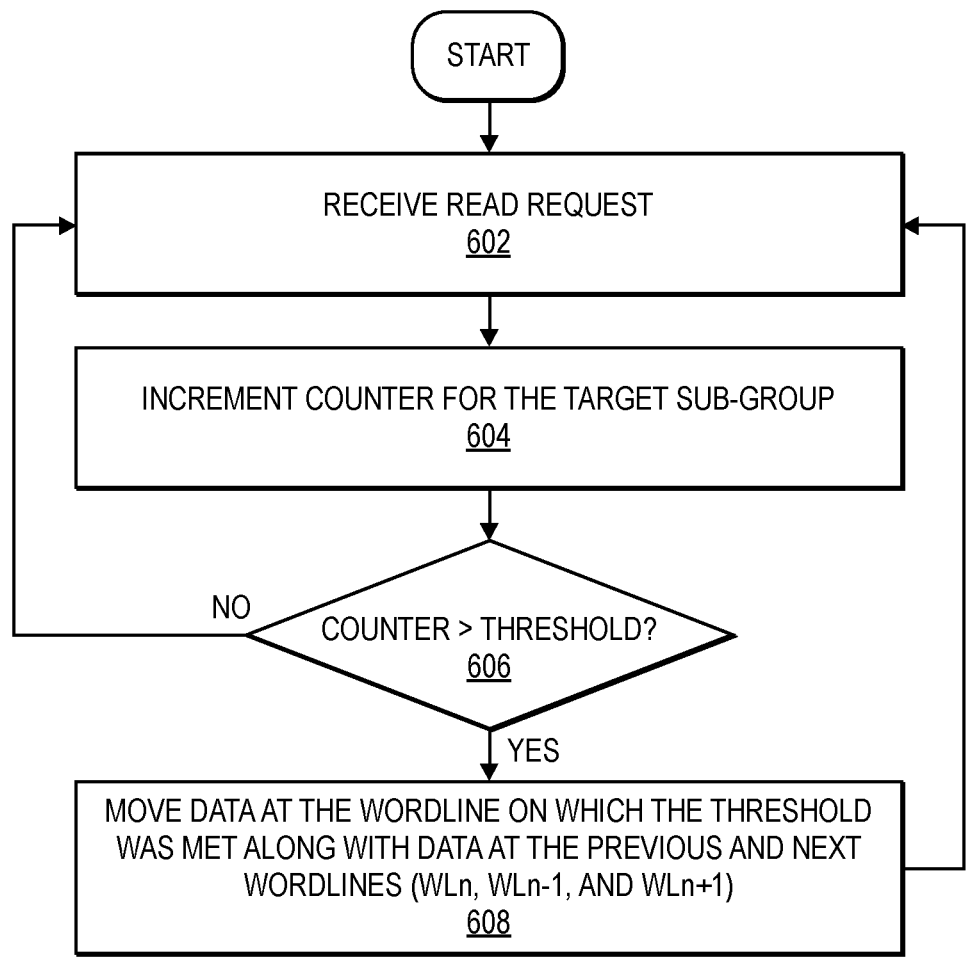
FIG. 6 is a flow chart of an example of a method of preventing read disturb.

FIG. 6 is a flow chart of an example of a method of preventing read disturb. In one example, the method is performed by logic of a non-volatile memory device. In one such example, the method is performed by firmware, microcode and/or circuitry on a 3D NAND die.

The method begins by receiving a read request, at 602. For example, referring to FIG. 3A, the memory device 300 receives a read request from a host 350 via interfaces 356 and 320. Firmware then determines the target sub-group(s) of the read request and increments the counter(s) for the target sub-group(s), at 604. In other implementations the counters could count down from an initial number to zero to indicate that a threshold is reached. In such an example, the counters would be decremented upon receipt of a read request to the target sub-group.

In one example, once the appropriate read counters are updated, the firmware checks if the counters for any of the sub-groups are greater than a threshold. Various policies can be employed for checking whether the read threshold for a particular sub-group or wordline is met. For example, the counters for each sub-group that is targeted by a read access can be checked after the read access. In another example, all read counters can be checked at some frequency that is predetermined, programmable, or based on a trigger. Regardless of the timing and frequency of checking whether read access counts meet the threshold, if none of the counters are greater than the threshold, 606 NO branch, then the method continues from block 602.

If any of the counters are greater than the threshold, 606 YES branch, then data at the wordlines on which the threshold was met is moved, at 608. Additionally, the data stored at two or more neighboring wordlines (e.g., stored at the previous and next wordlines) may also be moved to prevent read disturb on those wordlines and to maintain some data contiguity. However, unlike in conventional techniques, the entire block is not moved in response to detecting the threshold is met in the block. The amount of data moved in response to the threshold being met is less than the entire block (e.g., one or more wordlines of data in the block).

In one example, the data at those wordlines is moved to an SLC block. In one such example, the data is copied to contiguous locations on the SLC block so that the data from the hot wordline and neighboring wordlines remains contiguous. The method then involves updating an address map pointer to direct subsequent read requests for the wordline to the SLC buffer. In one example, the address map pointers can be updated after the entire data move completes or after every page is written to the SLC block. In an example in which the map pointer for the destination SLC block is updated after every page is written, subsequent host reads will be read from the SLC block even though the SLC block is not closed.

Thus, the method involves moving only the hot data and its neighboring wordlines from the QLC block to the SLC buffer without moving the all the data in the QLC block. The logical-to-physical page table is updated once the data has been moved to SLC, and if the host requests data, it will be read from the new SLC block. Although the example in FIG. 6 refers to moving three wordlines, other granularities of data can be moved. For example, the data at one or more sub-groups can be moved when the threshold is met rather than the entire wordline and neighboring wordlines.

Additionally, although the example in FIG. 6 refers to moving the hot data to an SLC block, other examples may move the hot data (e.g., the wordline and neighboring wordlines) to another type of memory block, such as MLC, TLC, QLC, etc. Regardless of the type of memory the hot data is moved to, a small amount of data (e.g., a few wordlines) is moved without moving the entire block, and therefore the move completes quicker than conventional techniques that require moving the entire block. However, moving the hot wordline and neighboring wordlines to an SLC block results in a further decrease in the time to complete the data move, and thus the performance impact to the host is significantly less than conventional techniques. The method also has less of a write amplification impact as only the affected wordlines are moved rather than moving the whole superblock. Furthermore, the data is still sequential because several consecutive wordlines are moved to the SLC block.

Figure 7A:
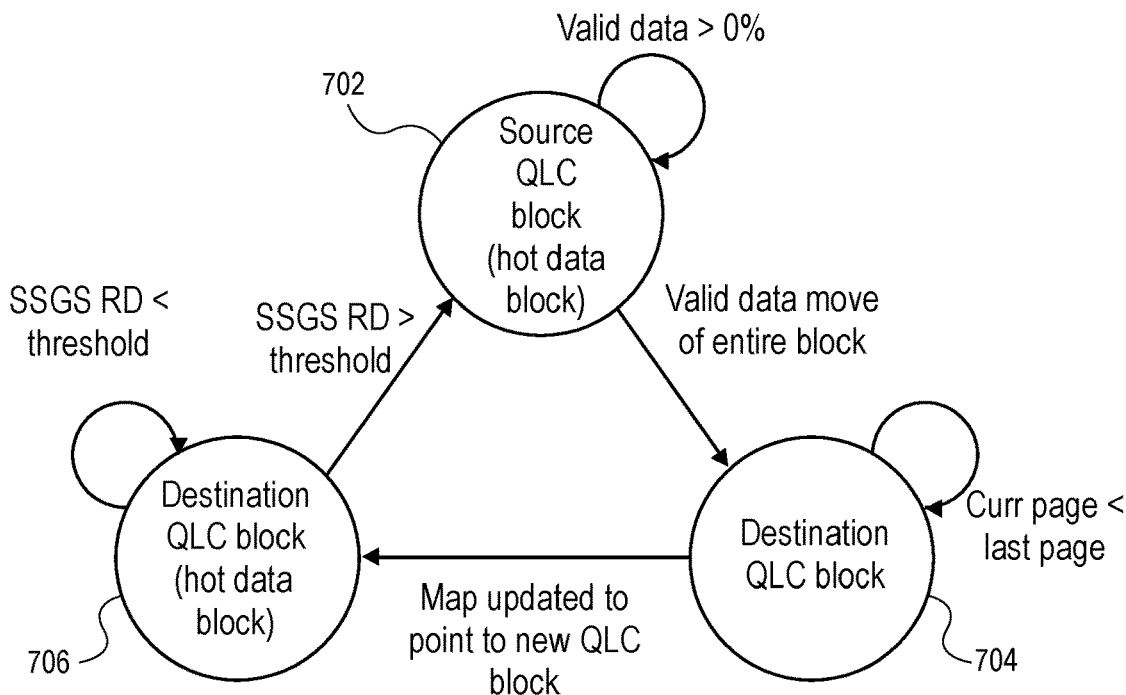
FIGS. 7A and 7B illustrate state diagrams for two different data move policies for read disturb prevention.
Figure 7B:
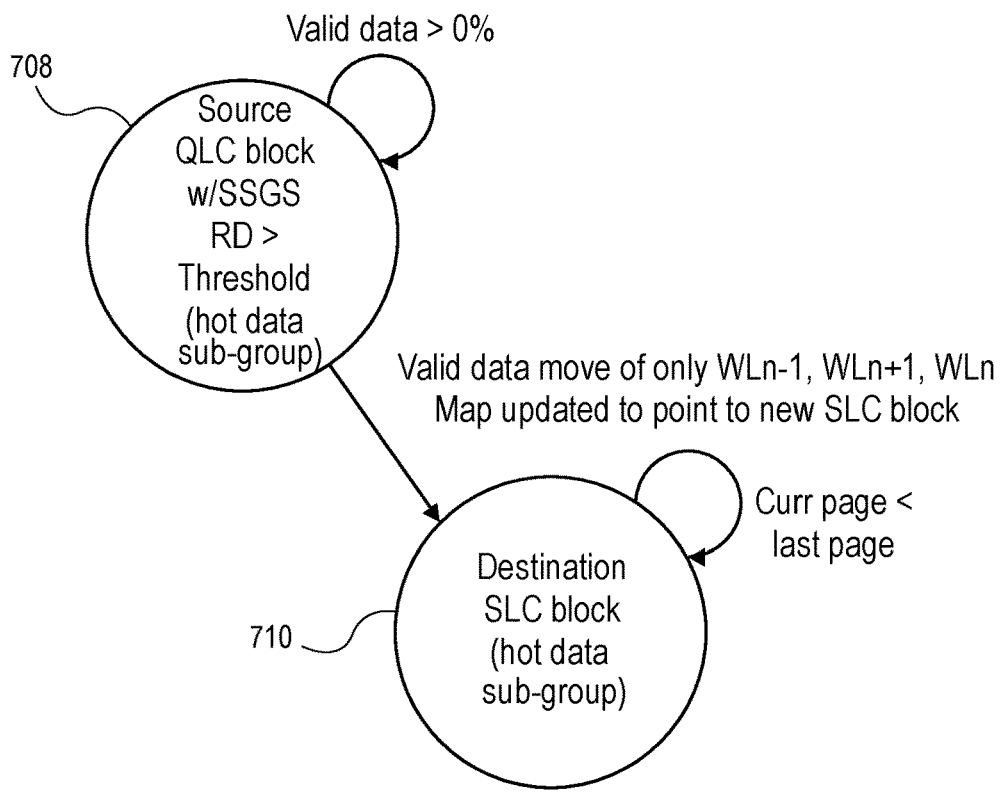

FIGS. 7A and 7B illustrate state diagrams for two different data move policies for read disturb prevention. FIG. 7A is an example of a state diagram for a conventional data move policy. In state 702 of the state diagram of FIG. 7A, a QLC block has been identified as a hot data block with valid data to be moved from the current source QLC block to another destination QLC block. According to conventional policies, if any sub-group or wordline in the block is hot, the entire block is moved. For example, all of the valid data from the entire source QLC block is then moved to a destination QLC block. The state machine moves to state 704 while the block is being moved (e.g., while the current page being moved is <last page). Once the entire block is moved successfully, the address map is updated to point to the new QLC block. The state machine then moves to state 706. The number of read accesses to the new QLC block is then monitored. When the number of read accesses reaches the threshold, the process is repeated, and the data is moved to another QLC block. Thus, the policy illustrated by the state diagram in FIG. 7A involves moving an entire QLC block of data to another QLC block of data.

In contrast, FIG. 7B illustrates an example of a state diagram in which only the hot wordline and neighboring wordlines are moved to an SLC block. In state 708 of the state diagram of FIG. 7B, a sub-group of a block has been identified as hot and having valid data. Instead of moving the data in the entire QLC block, only valid data at the hot wordline and the wordline before and after the hot wordline are moved to a destination SLC block. The address map is then updated to point to the new SLC block, taking the state diagram to state 710. Because a smaller amount of data is moved and because the data is moved to an SLC block instead of a QLC block, the data move completes much more quickly than the data move according to the data move policy in FIG. 7A. Thus, the time to complete the data move and update the map pointer can be significantly reduced. In one example, the data that was moved is left in the SLC block until additional space is needed in the SLC block. If additional space needs to be freed up in the SLC block, then the moved wordlines can be moved to another QLC block at that time.

Figure 8:
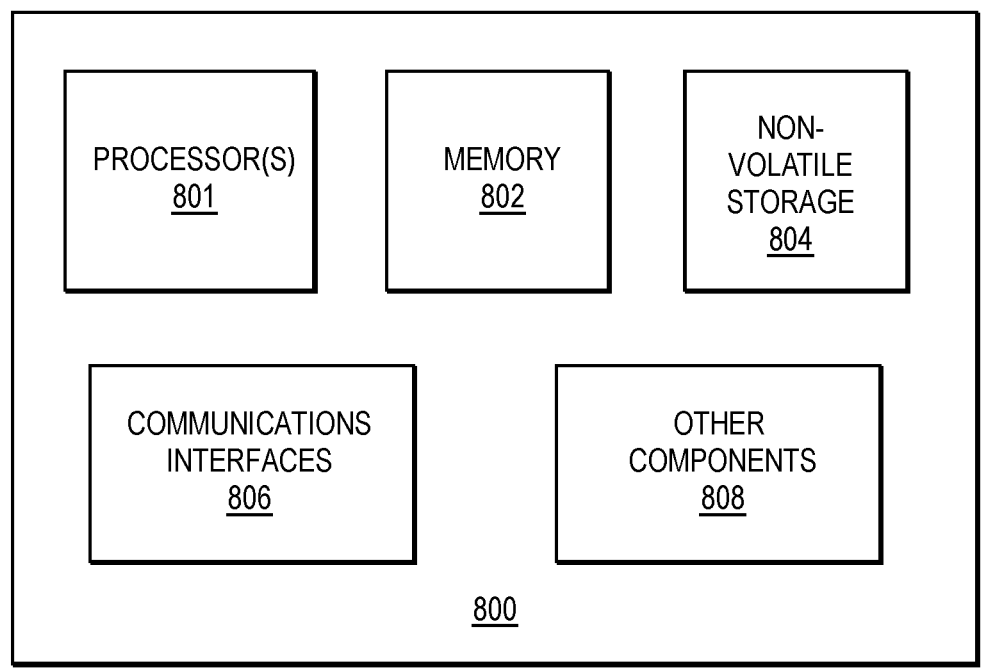
FIG. 8 provides an exemplary depiction of a computing system in read disturb prevention techniques can be implemented.

FIG. 8 provides an exemplary depiction of a computing system 800 (e.g., a smartphone, a tablet computer, a laptop computer, a desktop computer, a server computer, etc.). As observed in FIG. 8, the system 800 may include one or more processors or processing units 801. The processor(s) 801 may include one or more central processing units (CPUs), each of which may include, e.g., a plurality of general-purpose processing cores. The processor(s) 801 may also or alternatively include one or more graphics processing units (GPUs) or other processing units. The processor(s) 801 may include memory management logic (e.g., a memory controller) and I/O control logic. The processor(s) 801 can be similar to, or the same as, the processor 352 of FIG. 3.

The system 800 also includes memory 802 (e.g., system memory), non-volatile storage 804, communications interfaces 806, and other components 808, which may also be similar to, or the same as, components of the host 350 of FIG. 3. The other components may include, for example, a display device (e.g., touchscreen, flat-panel), a power supply (e.g., a battery or/or other power supply), sensors, power management logic, or other components. The communications interfaces 806 may include logic and/or features to support a communication interface. For these examples, communications interface 806 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 804, which may be the mass storage component of the system. The non-volatile storage device 804 can be similar to, the same as, or include the memory device 300 of FIG. 3, described above. The non-volatile storage 804 can include a solid state drive (SSD), a dual in-line memory module (DIMM), or other non-volatile storage. Non-volatile storage 804 may include byte or block addressable types of non-volatile memory having a 3-dimensional (3D) cross-point memory structure that includes a chalcogenide phase change material. Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 804 may include mass storage that is composed of one or more SSDs. SSDs can be composed of flash memory chips that are capable of implementing the read disturb prevention techniques described herein.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile storage device comprising:
a NAND storage array including blocks of memory cells;
logic to:
receive a read request to access a wordline in a first NAND memory block, each memory cell at the wordline to store two or more bits;
detect that a number of reads to the wordline exceeds a threshold;
move data stored at the wordline to an SLC (single level cell) buffer; and
update an address map pointer to direct subsequent read requests for the wordline to the SLC buffer.

2. The non-volatile storage device of claim 1, wherein:
the first NAND memory block is a QLC (quad level cell) NAND memory block.

3. The non-volatile storage device of claim 1, wherein the logic to move the data is to:
move only the data stored at the wordline and neighboring wordlines to the SLC buffer.

4. The non-volatile storage device of claim 3, wherein: the neighboring wordlines are adjacent to the wordline.

5. The non-volatile storage device of claim 1, wherein the logic to move the data is to:
move data stored at two or more neighboring wordlines without moving all the data stored in the first NAND memory block.

6. The non-volatile storage device of claim 3, wherein the logic to move the data is to:
copy data stored at the wordline and the neighboring wordlines to contiguous locations in the SLC buffer.

7. The non-volatile storage device of claim 1, wherein:
the data move to the SLC buffer is a blocking operation; and
the logic is to update the address map pointer after each page is moved.

8. The non-volatile storage device of claim 1, wherein the logic to detect that the number of reads to the wordline exceeds a threshold is to:
detect that a read counter for the wordline exceeds the threshold.

9. The non-volatile storage device of claim 8, wherein the read counter comprises:
a read counter for a superblock, the superblock comprising a same wordline address across multiple NAND dies.

10. The non-volatile storage device of claim 1, wherein the non-volatile storage device comprises a solid state drive (SSD).

11. A system comprising:
a three-dimensional (3D) NAND array including blocks of NAND memory cells;
a controller to access the 3D NAND array; and
logic to:
detect that a number of reads to a wordline in a first NAND memory block exceeds a threshold including to detect that a read counter for the wordline exceeds the threshold, each memory cell at the wordline to store two or more bits; and
cause data stored at the wordline to be moved to an SLC (single level cell) buffer.

12. The system of claim 11, further comprising:
one or more of: a processor, power supply, or display device.

13. An article of manufacture comprising a computer readable storage medium having content stored thereon which when accessed causes processing circuitry to execute operations to perform a method comprising:
receiving a read request to access a wordline in a first NAND memory block, each memory cell at the wordline to store two or more bits;
detecting that a number of reads to the wordline exceeds a threshold; and
moving data stored at the wordline to an SLC (single level cell) buffer, including moving second data stored at two or more neighboring wordlines without moving all the data stored in the first NAND memory block.

14. The article of manufacture of claim 13, wherein:
the first NAND memory block is a QLC (quad level cell) NAND memory block.

15. The article of manufacture of claim 13, wherein moving the data comprises:
moving only the data stored at the wordline and neighboring wordlines to the SLC buffer.

16. The article of manufacture of claim 15, wherein:
the neighboring wordlines are adjacent to the wordline.

17. The article of manufacture of claim 15, wherein moving the data comprises:
copying data stored at the wordline and the neighboring wordlines to contiguous locations in the SLC buffer.

18. The article of manufacture of claim 13, further comprising:
updating an address map pointer to direct subsequent read requests for the wordline to the SLC buffer.

* * * * *